(12) United States Patent
Shen

(10) Patent No.: US 10,332,980 B2
(45) Date of Patent: Jun. 25, 2019

(54) EPI INTEGRALITY ON SOURCE/DRAIN REGION OF FINFET

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventor: Zhaoxu Shen, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/612,805

(22) Filed: Jun. 2, 2017

(65) Prior Publication Data
US 2018/0006135 A1    Jan. 4, 2018

(30) Foreign Application Priority Data
Jul. 1, 2016    (CN) .......................... 2016 1 0510635

(51) Int. Cl.
*H01L 29/66*    (2006.01)
*H01L 29/06*    (2006.01)
(Continued)

(52) U.S. Cl.
CPC .... *H01L 29/66636* (2013.01); *H01L 29/0653* (2013.01); *H01L 29/0847* (2013.01);
(Continued)

(58) Field of Classification Search
CPC .......... H01L 29/66795; H01L 29/0847; H01L 29/66636; H01L 29/7848; H01L 29/66545; H01L 29/0653
See application file for complete search history.

(56) References Cited

U.S. PATENT DOCUMENTS 9,368,496 B1 * 6/2016 Yu ....................... H01L 27/0886
2014/0117454 A1 5/2014 Liu et al.
(Continued)

OTHER PUBLICATIONS

European Application No. 17178152.9, Extended European Search Report dated Nov. 21, 2017, 8 pages.

*Primary Examiner* — Caridad Everhart
(74) *Attorney, Agent, or Firm* — Kilpatrick Townsend & Stockton LLP

(57) ABSTRACT

A method for manufacturing a semiconductor device includes providing a substrate structure including a semiconductor fin on a substrate, and a trench isolation structure surrounding the fin and having an upper surface flush with an upper surface of the fin and including first and second trench isolation portions on opposite sides of the fin along the fin longitudinal direction, and third and fourth trench isolation portions on distal ends of the fin along a second direction intersecting the longitudinal direction; forming a patterned first hardmask layer having an opening exposing an upper surface of the third and fourth trench isolation portions; and forming a first insulator layer filling the opening to form an insulating portion including a portion of the first insulator layer in the opening and a portion of the trench isolation structure below the portion of the first insulator layer in the opening.

20 Claims, 17 Drawing Sheets

(51) Int. Cl.
*H01L 29/78* (2006.01)
*H01L 29/08* (2006.01)

(52) U.S. Cl.
CPC .. *H01L 29/66545* (2013.01); *H01L 29/66795* (2013.01); *H01L 29/7848* (2013.01); *H01L 29/7851* (2013.01)

(56) References Cited

U.S. PATENT DOCUMENTS

2015/0144999 A1* 5/2015 Ching ............... H01L 29/66795
　　　　　　　　　　　　　　　　　　　　　　　　　257/190
2015/0187571 A1　 7/2015 Fan et al.
2016/0104673 A1　 4/2016 Tung

* cited by examiner

EPI INTEGRALITY ON SOURCE/DRAIN REGION OF FINFET

CROSS-REFERENCES TO RELATED APPLICATIONS

The present application claims priority to Chinese patent application No. 201610510635.5, filed with the State Intellectual Property Office of People's Republic of China on Jul. 1, 2016, the content of which is incorporated herein by reference in its entirety.

TECHNICAL FIELD

The present disclosure relates to integrated semiconductor devices, and more particularly to methods for manufacturing a fin-type field effect transistor (FinFET).

BACKGROUND OF THE INVENTION

In semiconductor technology, a relatively high level of stress on epitaxially formed source/drain regions can improve the performance of a semiconductor device. In a fin field effect transistor (FinFET) manufacturing process, the integrity protection of epitaxially formed regions is very important and advantageous to improve the device performance by maintaining a high level of stress on the epitaxial regions. However, in the epitaxial process, the recess formed on the fin may have an irregular form, resulting in an incomplete epitaxial morphology, thereby decreasing the device performance.

At present, a dummy gate structure may be formed on opposite sides of a shallow trench isolation (STI) of the semiconductor fin to protect the distal ends of the fin to facilitate the epitaxial growth of the source and drain in subsequent processes.

BRIEF SUMMARY OF THE INVENTION

The present inventor discovered that in the prior art, after epitaxially forming the source and drain, during the removal of the dummy gate structure on the shallow trench isolation, an etching solution tends to cause damage to the semiconductor fin (e.g., silicon fin), or even removes a portion of the source and drain to cause damage to the source and drain, thereby degrading the performance of the semiconductor device.

Embodiments of the present invention provide a novel manufacturing method that can reduce the likelihood of damage when the dummy gate is removed. In accordance with some embodiments of the present invention, a method for manufacturing a semiconductor device may include providing a substrate structure including a substrate, at least one semiconductor fin on the substrate, and a trench isolation structure surrounding and laterally abutting the semiconductor fin and having an upper surface flush with an upper surface of the semiconductor fin, the trench isolation structure comprising a first trench isolation portion and a second trench isolation portion disposed on opposite sides of the semiconductor fin along a first direction parallel to a longitudinal direction of the semiconductor fin, and a third trench isolation portion and a fourth trench isolation portion on distal ends of the semiconductor fin along a second direction intersecting the first direction. The method may further include forming a patterned first hardmask layer having an opening on the substrate structure, the opening exposing an upper surface of the third and fourth trench isolation portions; forming a first insulator layer filling the opening to form an insulating portion including a portion of the first insulator layer in the opening and a portion of the trench isolation structure below the portion of the first insulator layer in the opening; removing the patterned first hardmask layer exposing a portion of the semiconductor fin below the patterned first hardmask layer and the upper surface of the trench isolation structure; and removing a portion of the first insulator layer and a portion of the exposed trench isolation structure such that an upper surface of the first and second trench isolation portions is lower than the upper surface of the semiconductor fin to expose an upper portion of the semiconductor fin and an upper portion of the insulating portion.

In one embodiment, the opening also exposes opposite distal ends of the semiconductor fin in the longitudinal direction.

In one embodiment, the method may further include, after forming the patterned first hardmask layer and prior to forming the first insulator layer, performing an etching process on the exposed third and fourth trench isolation portions and the distal ends of the semiconductor fin.

In one embodiment, the trench isolation structure includes a trench adjacent to the semiconductor fin and a dielectric layer filling the trench.

In one embodiment, the patterned first hardmask layer includes silicon nitride, the first insulator layer includes silicon dioxide, and the dielectric layer includes silicon dioxide.

In one embodiment, the method may further include forming a first gate structure surrounding a portion of the upper portion of the semiconductor fin and a second gate structure on the upper portion of the insulating portion. The first gate structure includes a first gate insulator layer surrounding a portion of the upper portion of the semiconductor fin, a first gate on the first gate insulator layer, and a second hardmask layer on the first gate. The second gate structure includes a second gate insulator layer on the upper portion of the insulating portion, a second gate on the second gate insulator layer, and a third hardmask layer on the second gate.

In one embodiment, the first gate insulator layer and the second insulator layer each include silicon dioxide; the first gate and the second gate each include polysilicon; the second hardmask layer and the third hardmask layer each include silicon nitride.

In one embodiment, the method may further include forming spacers on opposite side surfaces of the first gate structure and on opposite side surfaces of the second gate structure. The spacers cover the distal ends of the semiconductor fin in the longitudinal direction.

In one embodiment, the method may further include removing by etching a portion of the semiconductor fin that is not covered by the first gate structure and the spacers to form a recess region, and forming a source or a drain having a material different than a material of the semiconductor fin in the recess region.

In one embodiment, the recess region includes a first recess and a second recess on opposite sides of the first gate structure, and forming the source or the drain comprises forming the source in the first recess and forming the drain in the second recess.

In one embodiment, forming the patterned first hardmask layer may include forming a first hardmask layer on the substrate structure; forming a patterned mask layer on the first hardmask layer; etching the first hardmask layer using the patterned mask layer as a mask to form an opening that exposes an upper surface of the third and fourth trench portions of the semiconductor fin; and removing the patterned mask layer.

In one embodiment, forming the first insulator layer filling the opening includes forming the first insulator layer on the substrate structure filling the opening and covers the patterned first hardmask layer, and planarizing the first insulator layer to expose the upper surface of the patterned first hardmask layer.

Embodiments of the present invention also provide a semiconductor device. The semiconductor device may include a substrate; at least one semiconductor fin on the substrate; and a trench isolation structure surrounding and laterally abutting the semiconductor fin. The trench isolation structure includes first and second trench isolation portions on opposite sides of the semiconductor fin along a first direction parallel to a longitudinal direction of the semiconductor fin; and third and fourth trench isolation portions on opposite distal ends of the semiconductor fin along a second direction intersecting the first direction. The first and second trench isolation portions each have an upper surface that is lower than an upper surface of the semiconductor fin to expose an upper portion of the semiconductor fin and an upper portion of the first and second trench isolation portions.

In one embodiment, the trench isolation structure includes a trench adjacent to the semiconductor fin and a dielectric layer filling the trench.

In one embodiment, the semiconductor device may further include a first gate structure surrounding a portion of the upper portion of the semiconductor fin; and a second gate structure on the upper portion of the first and second trench isolation portions.

In one embodiment, the first gate structure includes a first gate insulator layer surrounding a portion of the upper portion of the semiconductor fin, a first gate on the first gate insulator layer, and a second hardmask layer on the first gate. The second gate structure comprises a second gate insulator layer on the upper portion of the first and second trench isolation portions, a second gate on the second gate insulator layer, and a third hardmask layer on the second gate.

In one embodiment, the first gate insulator layer and the second insulator layer each include silicon dioxide; the first gate and the second gate each include polysilicon; the second hardmask layer and the third hardmask layer each comprise silicon nitride.

In one embodiment, the semiconductor device may further includes spacers on opposite side surfaces of the first gate structure and on opposite side surfaces of the second gate structure, wherein the spacers cover the distal ends of the semiconductor fin in the longitudinal direction.

In one embodiment, the semiconductor device may further include a source or a drain having a material different than a material of the semiconductor fin on opposite sides of the first gate structure.

The following description, together with the accompanying drawings, will provide a better understanding of the nature and advantages of the claimed invention.

DETAILED DESCRIPTION OF THE INVENTION

Figure 1:
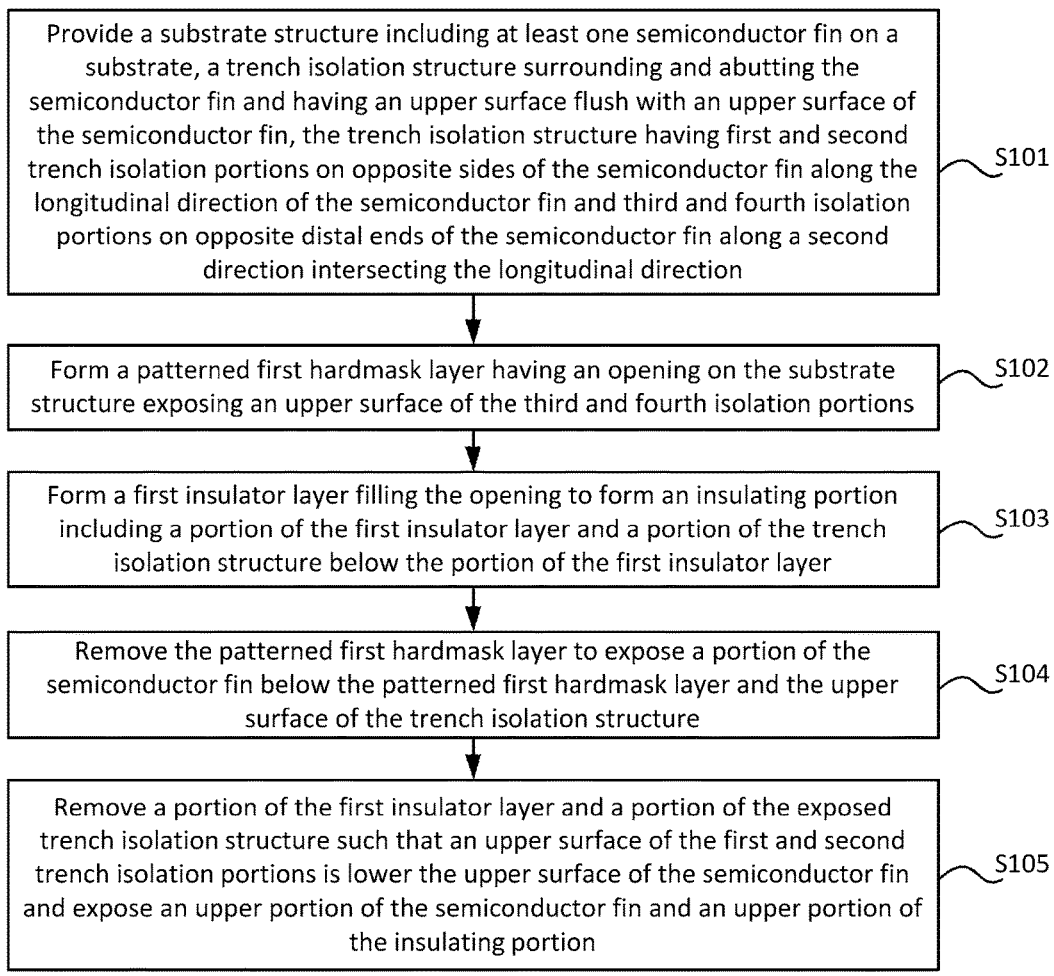
FIG. 1 is a flow chart of a method for manufacturing a semiconductor device according to an embodiment of the present invention.

Embodiments of the present disclosure now will be described more fully hereinafter with reference to the accompanying drawings. The disclosure may, however, be embodied in many different forms and should not be construed as limited to the embodiments set forth herein. Rather, these embodiments are provided so that this disclosure will be thorough and complete, and will fully convey the scope of the disclosure to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" or "bottom" and "top" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the disclosure. As used herein, the singular forms "a", "an", and "the" are intended to include the plural forms as well, unless the context clearly indicates otherwise. It will be further understood that the terms "comprises", "comprising", "having", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the disclosure are described herein with reference to cross-sectional illustrations that are schematic illustrations of idealized embodiments (and intermediate structures) of the disclosure. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the disclosure.

Embodiments of the present disclosure now will be described more fully hereinafter with reference to the accompanying drawings, in which embodiments of the disclosure are shown. This disclosure may, however, be embodied in many different forms and should not be construed as limited to the embodiments set forth herein.

The present inventor discovered, in the prior art, after epitaxially forming the source and drain, in the removal of the dummy gate structure on the STI, the etchant (e.g., NH₄OH) tends to cause damage to the semiconductor fin (e.g., silicon), for example, causing damage to the channel region, and sometimes the etchant also removes a portion of the source and drain causing damage to the source and drain, thereby degrading the performance of the device.

FIG. 1 is a flowchart of a method for manufacturing a semiconductor device according to an embodiment of the present disclosure. FIGS. 2A-2C, FIGS. 3A-3C, FIGS. 4A-4C, FIGS. 5A-5C, FIGS. 6A-6D, FIGS. 7A-7C, FIGS. 8A-8C, FIGS. 9A-9C, FIGS. 10A-10B, FIGS. 11A-11B, and FIGS. 12A-12B are simplified respective plan and cross-sectional views illustrating intermediate stages of a semiconductor structure in different process steps of a method of manufacturing according to some embodiments of the present disclosure.

Referring to FIG. 1, the method may include providing a semiconductor structure in step S101.

Figure 2A:
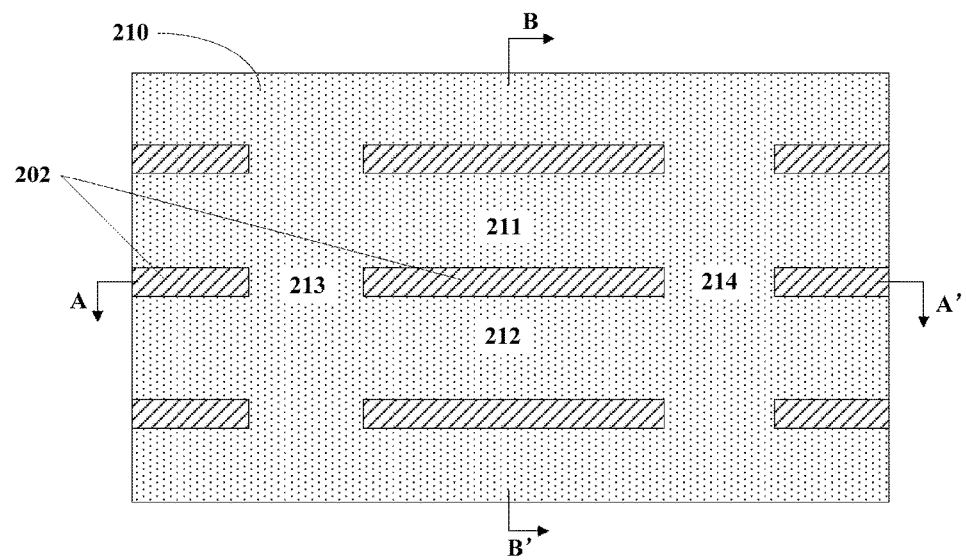
FIG. 2A is a simplified plan view illustrating a structure of a stage in a manufacturing method of a semiconductor device according to an embodiment of the present invention.
Figure 2B:
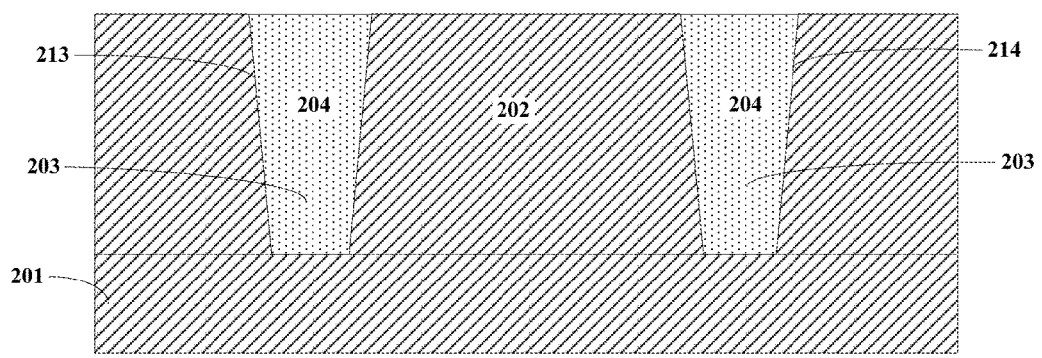
FIG. 2B is a simplified cross-sectional view illustrating a structure taken along the line A-A' of FIG. 2A.
Figure 2C:
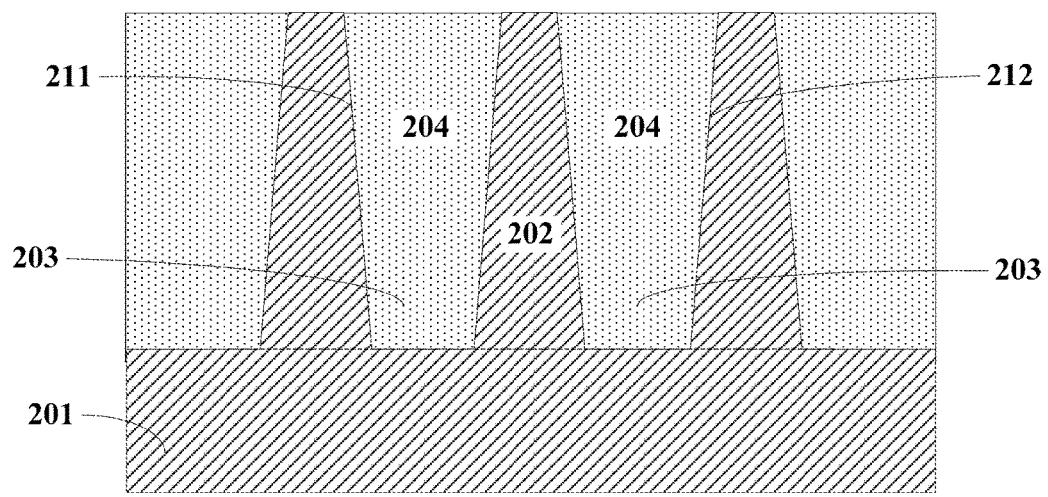
FIG. 2C is a simplified cross-sectional view illustrating a structure taken along the line B-B' of FIG. 2A.

FIG. 2A is a simplified plan view illustrating a structure of a stage in a manufacturing method of a semiconductor device in step S101 according to an embodiment of the present invention. FIG. 2B is a simplified cross-sectional view illustrating a structure taken along the line A-A' of FIG. 2A. FIG. 2C is a simplified cross-sectional view illustrating a structure taken along the line B-B' of FIG. 2A.

Referring to FIGS. 2A through 2C, a substrate structure is provided. The substrate structure may include a substrate (e.g., silicon substrate) 201, one or more semiconductor fins 202 on substrate 201, and a trench isolation structure 210 surrounding the one or more semiconductor fins 201. In an embodiment, trench isolation structure 210 abuts the corresponding one or more semiconductor fins 202 and has an upper surface flush with the upper surface of the one or more semiconductor fins 202. In the following description, the one or more semiconductor fins will be referred to as the "semiconductor fin". As can be appreciated, a FinFET can have one or more fins. In the following detailed description, exemplary embodiments will use a semiconductor fin to describe the scope of the invention. One of the skill in the art will appreciate that the exemplary embodiments may also applied to a plurality of semiconductor fins.

In one embodiment, as shown in FIGS. 2A, 2B, and 2C, trench isolation structure 210 may include a first trench isolation portion 211 and a second trench isolation portion 212 on opposite sides of a semiconductor fin along a first direction parallel to a longitudinal direction of the semiconductor fin, and a third trench isolation portion 213 and a fourth trench isolation portion 214 on opposite distal ends of the semiconductor fin along a second direction intersecting the first direction, i.e., the second direction is the transverse direction to the first direction or the longitudinal direction. In one embodiment, two longitudinally aligned semiconductor fins may share a same third trench isolation portion or a fourth trench isolation portion. In one embodiment, the second direction is perpendicular to the longitudinal direction of the semiconductor fin.

In one embodiment, as shown in FIGS. 2B and 2C, trench isolation structure 210 may include a trench 203 adjacent to a semiconductor fin and a dielectric layer 204 that fills the trench. For example, the dielectric layer may include silicon dioxide.

In one embodiment, the step for forming the substrate structure may include forming an interface insulator layer (e.g., silicon dioxide) on a substrate (e.g., a silicon substrate), and forming a fourth hardmask layer (e.g., silicon nitride) on the interface insulator layer. In one embodiment, the step for forming the substrate structure may further include etching the fourth hardmask layer, the interface insulator layer, and the substrate to form a semiconductor fin, wherein a trench is formed surrounding the semiconductor fin. In one embodiment, the step for forming the substrate structure may further include forming a dielectric layer filling the trench using a deposition process. In one embodiment, the step for forming the substrate structure may further include planarizing the dielectric layer. In one embodiment, the step for forming the substrate structure may further include etching the dielectric layer in the trench to formed a recess in the dielectric layer. In one embodiment, the step for forming the substrate structure may further include removing the fourth hardmask layer. In one embodiment, the step for forming the substrate structure may further include removing the interface insulator layer and a portion of the dielectric layer to expose the semiconductor fin and such that the upper surface of the dielectric layer is flush with the upper surface of the semiconductor fin.

Referring back to FIG. 1, in step S102, the method may include forming a patterned first hardmask layer having an opening exposing an upper surface of the third and fourth trench isolation portions for the semiconductor fin on the substrate structure.

Figure 4A:
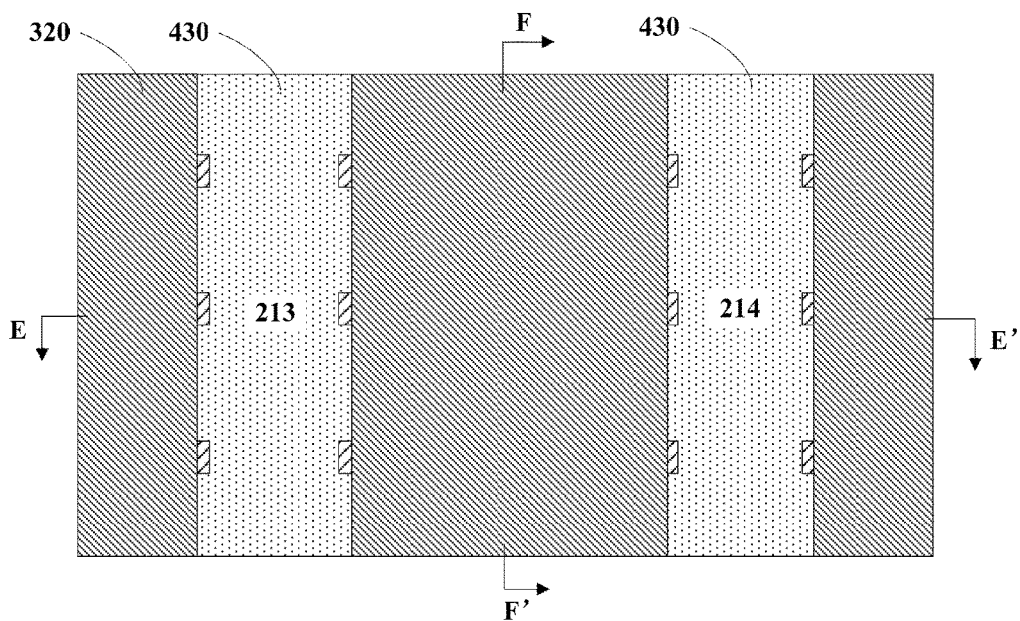
FIG. 4A is a simplified plan view illustrating a structure of a stage in a manufacturing method of a semiconductor device according to an embodiment of the present invention.
Figure 4B:
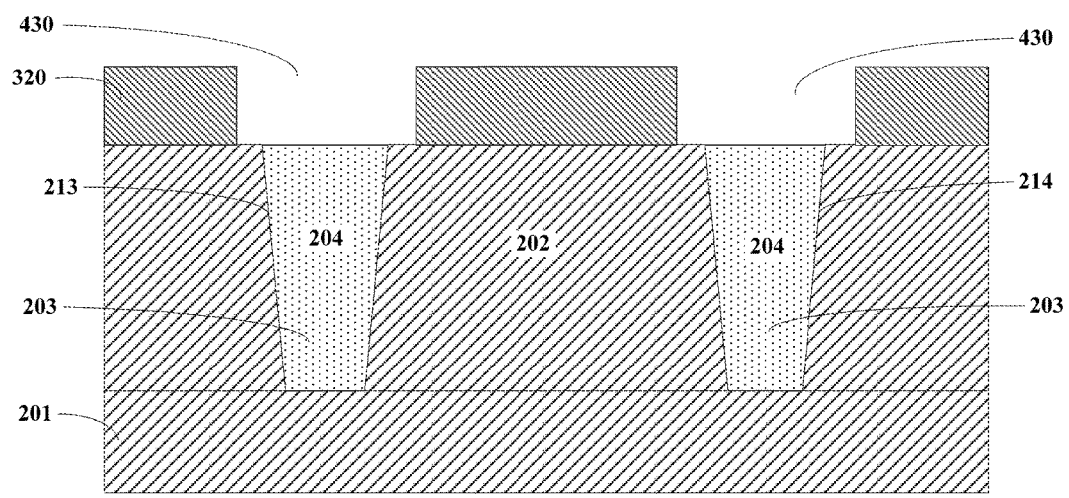
FIG. 4B is a simplified cross-sectional view illustrating a structure taken along the line E-E' of FIG. 4A.
Figure 4C:
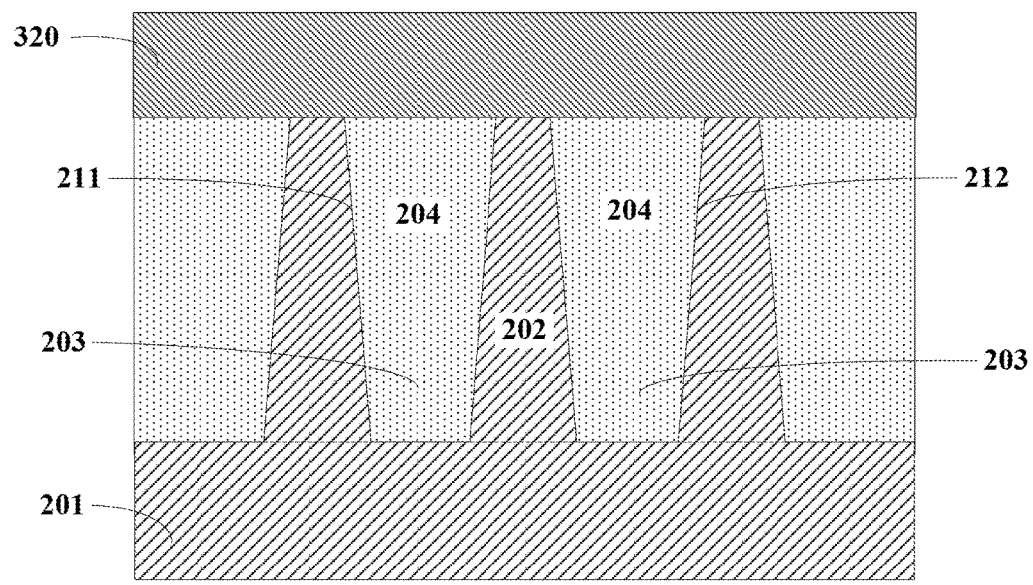
FIG. 4C is a simplified cross-sectional view illustrating a structure taken along the line F-F' of FIG. 4A.

FIG. 4A is a simplified plan view illustrating a structure of a stage in a manufacturing method of a semiconductor device in step S102 according to an embodiment of the present invention. FIG. 4B is a simplified cross-sectional view illustrating a structure taken along the line E-E' of FIG. 4A. FIG. 4C is a simplified cross-sectional view illustrating a structure taken along the line F-F' of FIG. 4A. Referring to FIGS. 4A through 4C, a patterned first hardmask layer 320 is formed. Patterned first hardmask layer 320 has an opening 430 exposing the upper surface of respective third trench isolation portion 213 and fourth trench isolation portion 214. In one embodiment, as shown in FIGS. 4A and 4B, opening 430 may also expose the distal ends of the semiconductor fin in the longitudinal direction. In some embodiments, the first hardmask layer may include a material having a relatively low etch selectivity relative to silicon and silicon dioxide. For example, the etching process may include a reactive ion etching (ME) and/or wet etching process. The first hardmask layer may include silicon nitride.

Figure 3A:
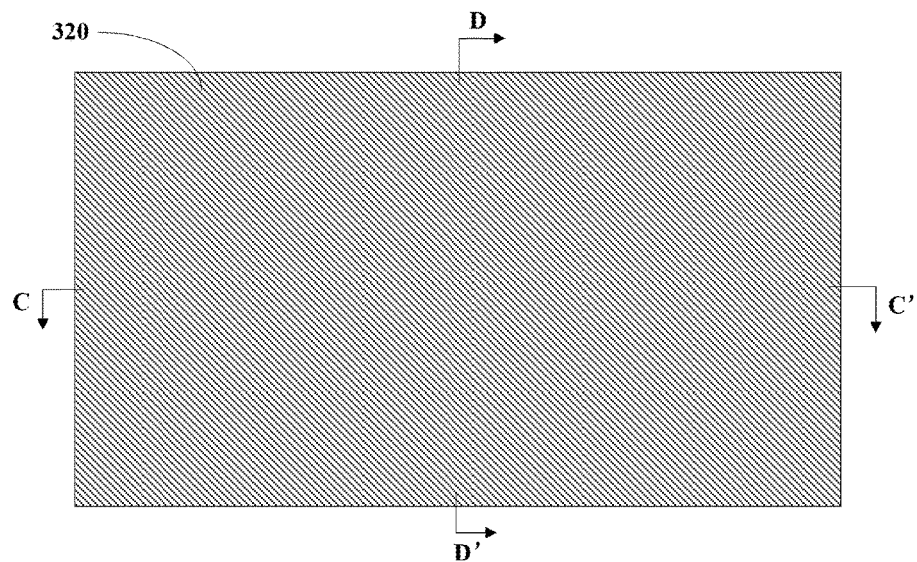
FIG. 3A is a simplified plan view illustrating a structure of a stage in a manufacturing method of a semiconductor device according to an embodiment of the present invention.
Figure 3B:
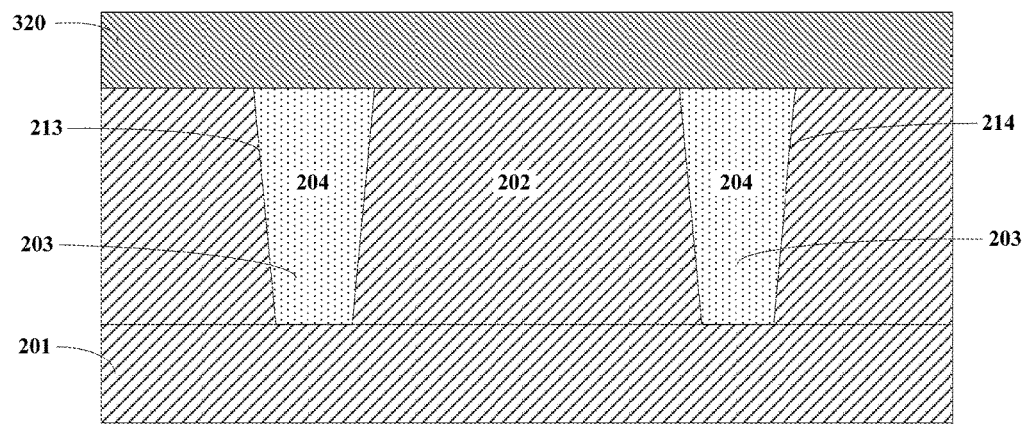
FIG. 3B is a simplified cross-sectional view illustrating a structure taken along the line C-C' of FIG. 3A.
Figure 3C:
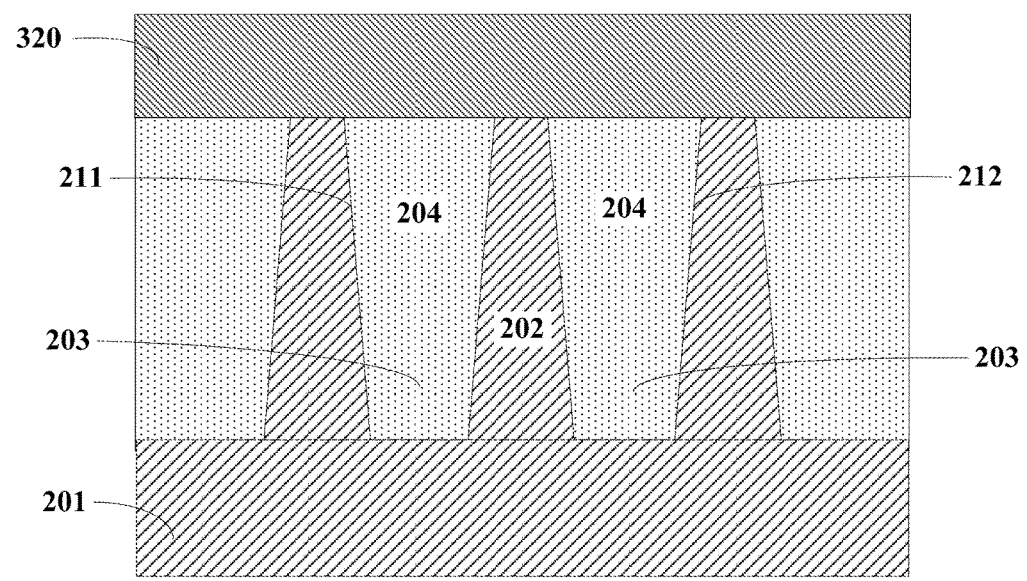
FIG. 3C is a simplified cross-sectional view illustrating a structure taken along the line D-D' of FIG. 3A.

The process of forming the first hardmask layer according to one embodiment of the present invention is described below in conjunction with FIGS. 3A, 3B, 3C, 4A, 4B, and 4C. In one embodiment, the step of forming the first hardmask layer may include forming a hardmask layer 320 using a deposition process, as shown in FIGS. 3A, 3B, and 3C. In one embodiment, the step of forming the first hardmask layer may also include forming a patterned mask layer (e.g., a photoresist not shown in the figures) on first hardmask layer 320 using a photolithography process. In one embodiment, the step of forming the first hardmask layer may also include etching first hardmask layer 320 using the patterned mask layer as a mask (e.g., using RIE and/or wet etching process) to form an opening 430 exposing the upper surface of respective third trench isolation portion 213 and fourth trench isolation portion 214. In one embodiment, the step of forming the first hardmask layer may also include removing the mask layer to form a structure as shown in FIGS. 4A, 4B, and 4C.

Referring back to FIG. 1, in step S103, the method may also include forming a first insulator layer filling the opening to form an insulating portion including a portion of the first insulator layer and the underlying trench isolation structure.

Figure 6A:
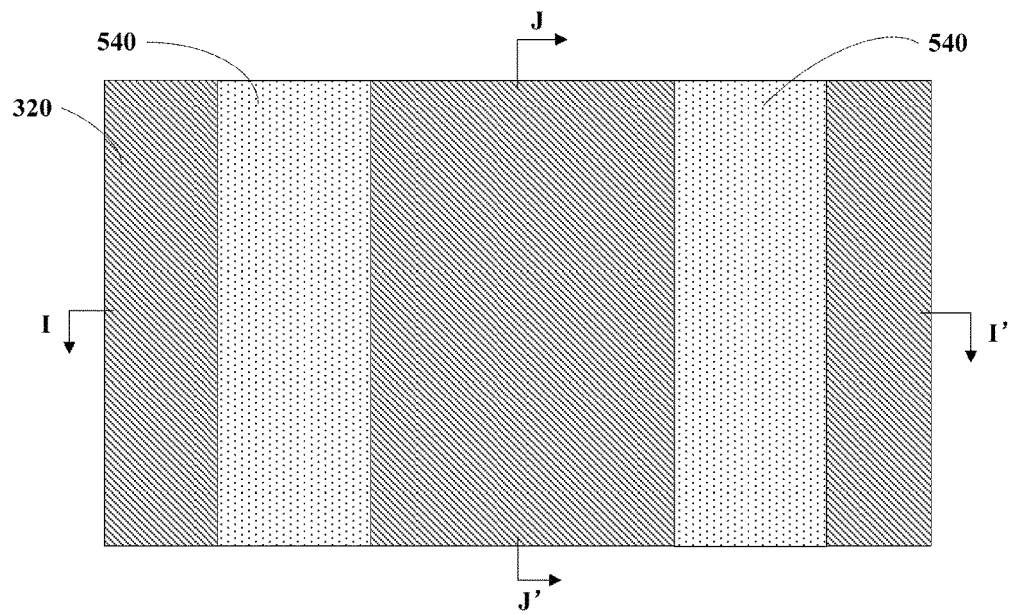
FIG. 6A is a simplified plan view illustrating a structure of a stage in a manufacturing method of a semiconductor device according to an embodiment of the present invention.
Figure 6B:
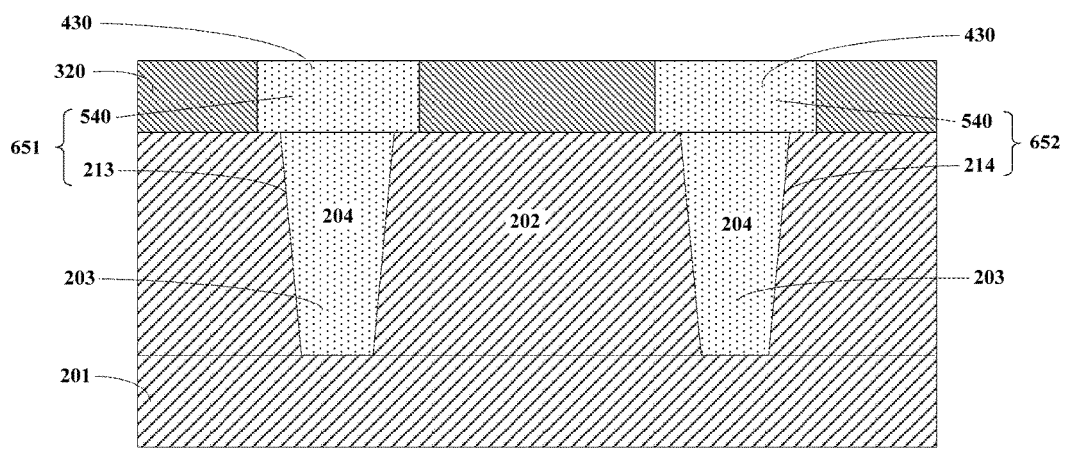
FIG. 6B is a simplified cross-sectional view illustrating a structure taken along the line I-I' of FIG. 6A.
Figure 6C:
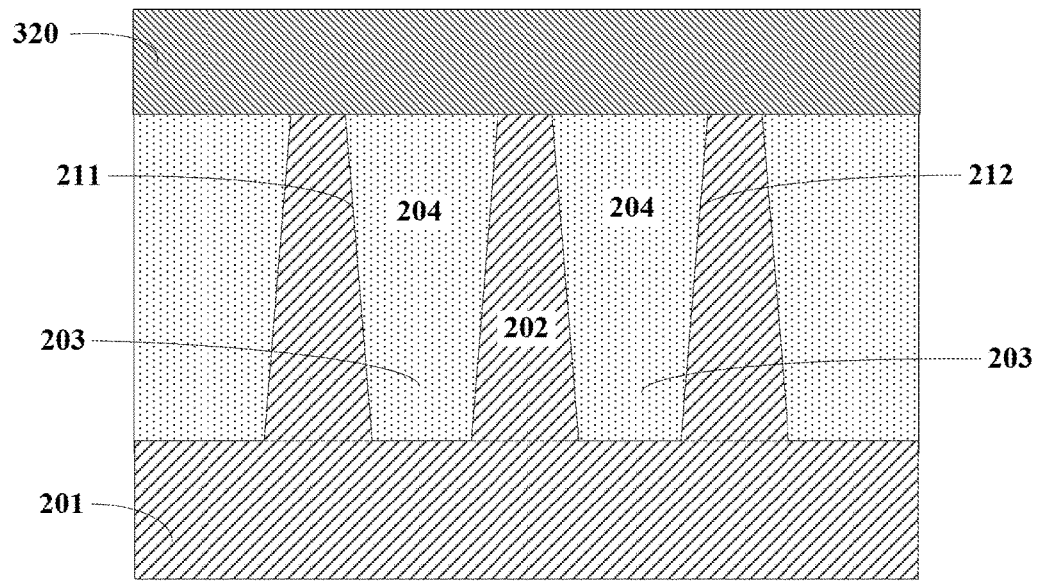
FIG. 6C is a simplified cross-sectional view illustrating a structure taken along the line J-J' of FIG. 6A.

FIG. 6A is a simplified plan view illustrating a structure of a stage in a manufacturing method of a semiconductor device in step S103 according to an embodiment of the present invention. FIG. 6B is a simplified cross-sectional view illustrating a structure taken along the line I-I' of FIG. 6A. FIG. 6C is a simplified cross-sectional view illustrating a structure taken along the line J-J' of FIG. 6A. Referring to FIGS. 6A through 6C, a first insulator layer 540 is formed filling the opening to form an insulating portion including a portion of first insulator layer 540 and the underlying trench isolation structure. In one embodiment, a first insulating portion 651 includes a first portion of first insulator layer 540 and third isolation portion 213 below the first portion of first insulator layer 540; a second insulating portion 651 includes a second portion of first insulator layer 540 and fourth isolation portion 214 below the second portion of first insulator layer 540. The insulating portion may include first insulating portion 651 and second insulating portion 652.

Figure 6D:
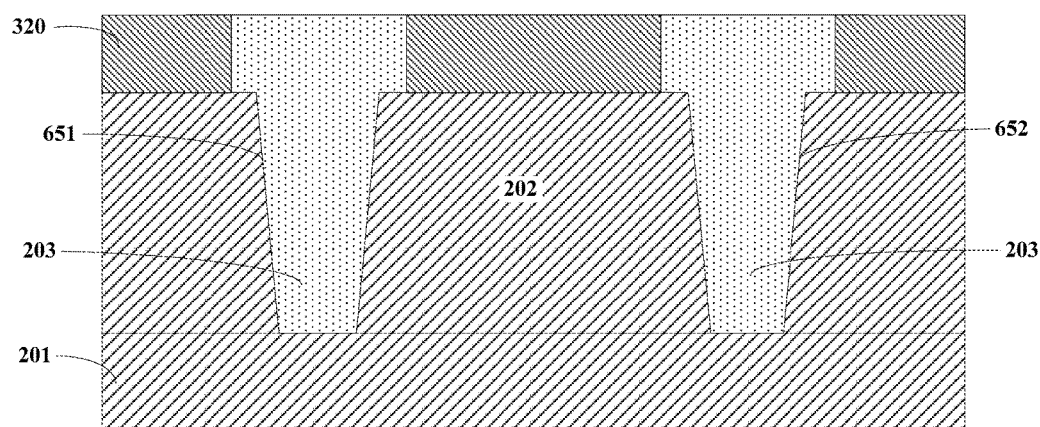
FIG. 6D is a simplified cross-sectional view illustrating a structure taken along the line I-I' of FIG. 6A.

For the purpose of illustration, a first portion of first insulator layer 540 and third trench isolation portion 213 disposed therebelow are shown as an integrated insulating portion 651, and the second portion of first insulator layer 540 and fourth trench isolation portion 213 disposed therebelow are shown as an integrated insulating portion 652, as shown in FIG. 6D. First insulating portion 651 and second insulating portion 652 will be used in the drawings of subsequent steps.

It is noted that first insulator layer 540 has the same material, or different materials as that of dielectric layer 204. In one embodiment, first insulator layer 540 may include silicon dioxide.

Figure 5A:
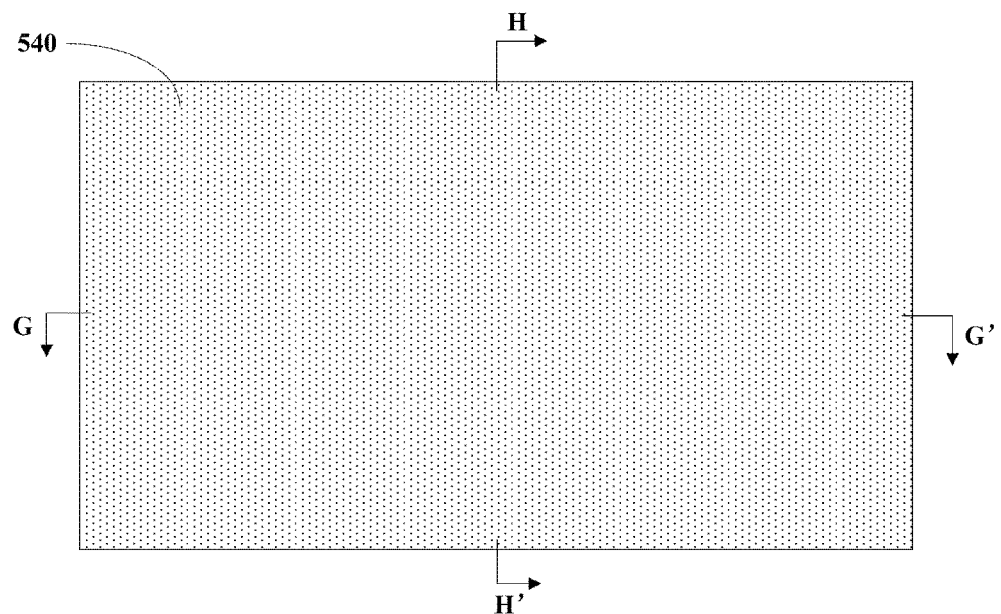
FIG. 5A is a simplified plan view illustrating a structure of a stage in a manufacturing method of a semiconductor device according to an embodiment of the present invention.
Figure 5B:
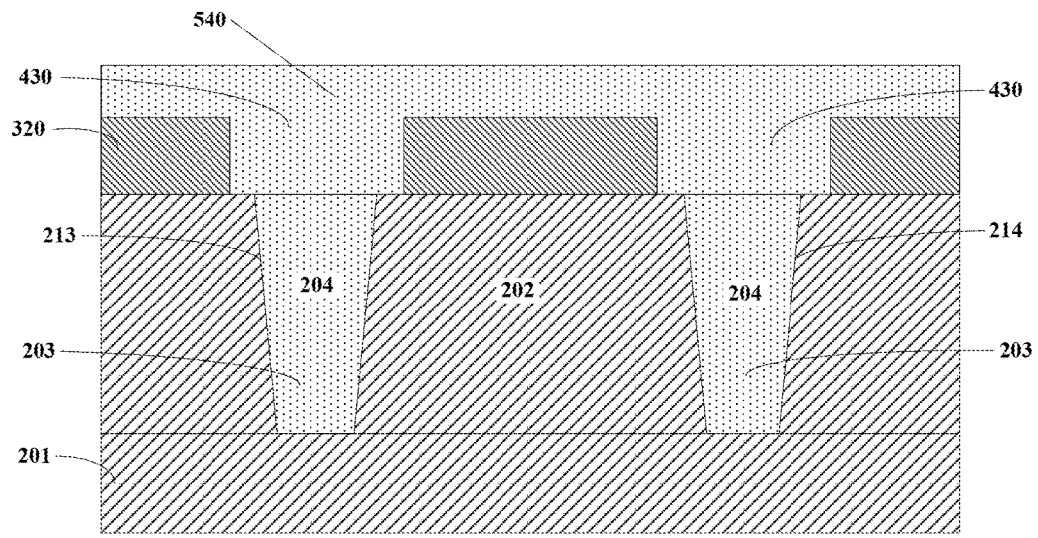
FIG. 5B is a simplified cross-sectional view illustrating a structure taken along the line G-G' of FIG. 5A.
Figure 5C:
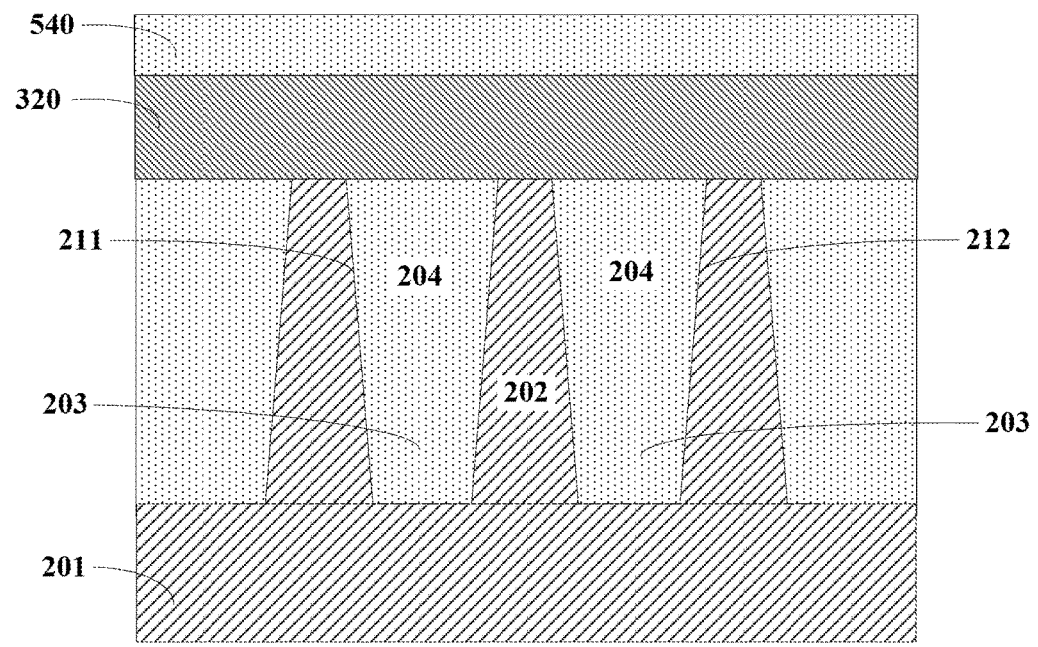
FIG. 5C is a simplified cross-sectional view illustrating a structure taken along the line H-H' of FIG. 5A.

The process of forming the first insulator layer (i.e., step S103) according to one embodiment of the present invention will be described with reference to FIGS. 5A, 5B, 5C, 6A, 6B, and 6C. In one embodiment, step S103 may include forming a first insulator layer 540 on first hardmask layer 320 of the substrate structure using a deposition process, as shown in FIGS. 5A, 5B, and 5C. First insulator layer 540 fills opening 430 and covers first hardmask layer 320. In one embodiment, step S103 may also include planarizing (e.g., chemical mechanical planarization) first insulator layer 540 to expose the upper surface of hardmask layer 320.

In one embodiment, after step S102 and prior to step S103, the method may include performing an etch process on the third and fourth isolating portions and the distal ends of the semiconductor fin. In one embodiment, the etched portion of the distal ends may range between 1 nm and 10 nm.

Referring back to FIG. 1, in step S104, the method may also include removing the first hardmask layer to expose a portion of the semiconductor fin disposed therebelow and an upper surface of the trench isolation structure.

Figure 7A:
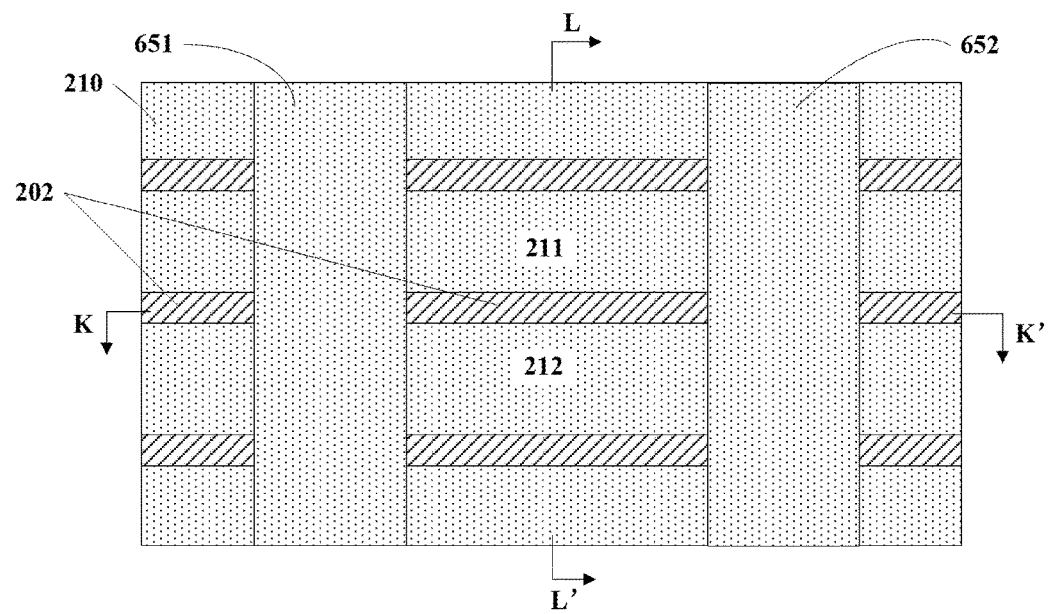
FIG. 7A is a simplified plan view illustrating a structure of a stage in a manufacturing method of a semiconductor device according to an embodiment of the present invention.
Figure 7B:
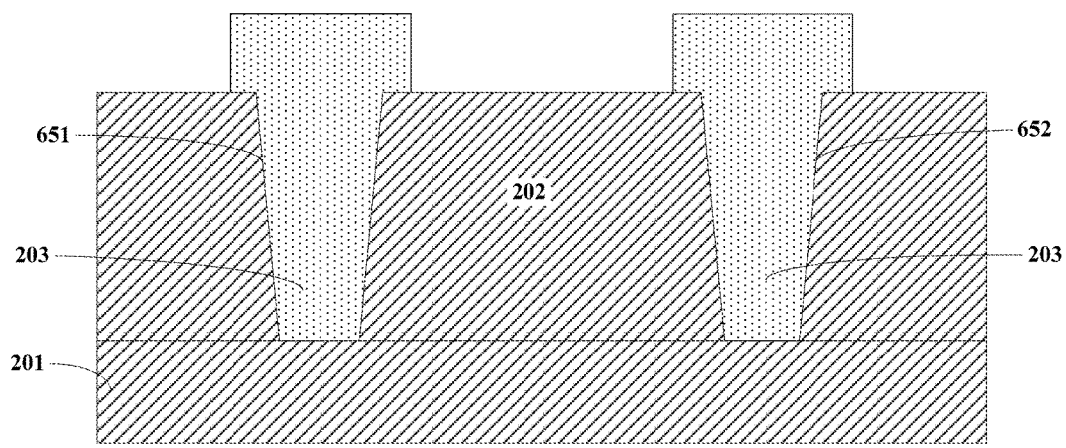
FIG. 7B is a simplified cross-sectional view illustrating a structure taken along the line K-K' of FIG. 7A.
Figure 7C:
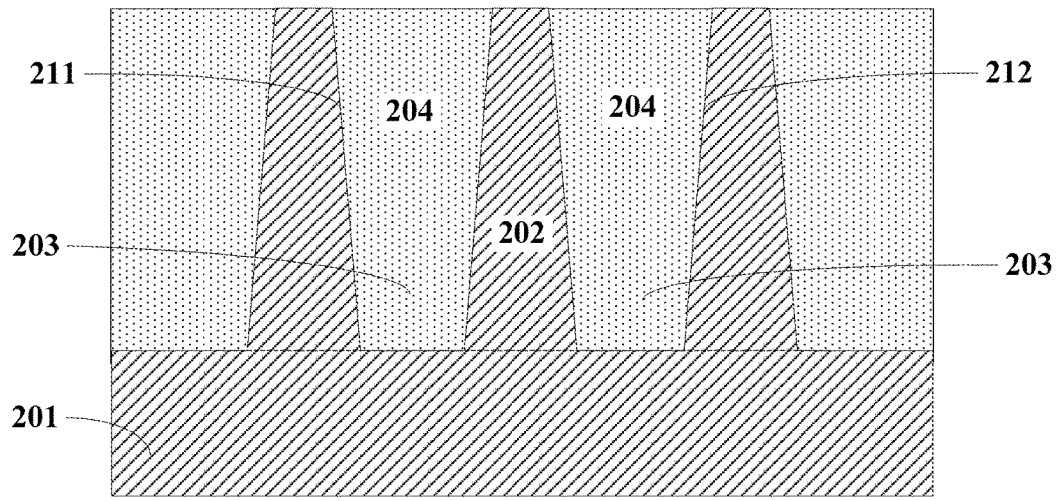
FIG. 7C is a simplified cross-sectional view illustrating a structure taken along the line L-L' of FIG. 7A.

FIG. 7A is a simplified plan view illustrating a structure of a stage in a manufacturing method of a semiconductor device in step S104 according to an embodiment of the present invention. FIG. 7B is a simplified cross-sectional view illustrating a structure taken along the line K-K' of FIG. 7A. FIG. 7C is a simplified cross-sectional view illustrating a structure taken along the line L-L' of FIG. 7A. Referring to FIGS. 7A through 7C, first hardmask layer 320 is removed to expose a portion of semiconductor fins 202 disposed therebelow and the upper surface of trench isolation structure 210, such as first trench isolation portion 211 and second trench isolation portion 212. In one embodiment, if first hardmask layer 320 includes silicon nitride, hot phosphoric acid may be used to remove the first hardmask layer.

Referring back to FIG. 1, in step S105, the method may also include removing at least a portion of the insulator layer and a portion of the exposed trench isolation structure such that the upper surface of the first and second trench isolation portions are lower than the upper surface of the semiconductor fin to expose an upper portion of the semiconductor fin in order to expose an upper portion of the semiconductor fin and an upper portion of the isolating portion.

Figure 8A:
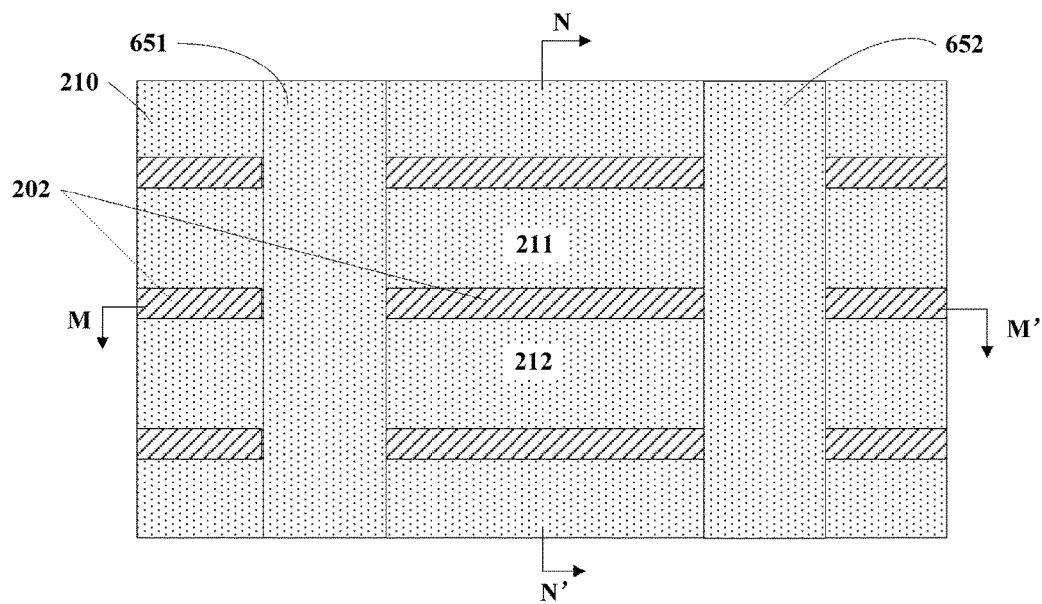
FIG. 8A is a simplified plan view illustrating a structure of a stage in a manufacturing method of a semiconductor device according to an embodiment of the present invention.
Figure 8B:
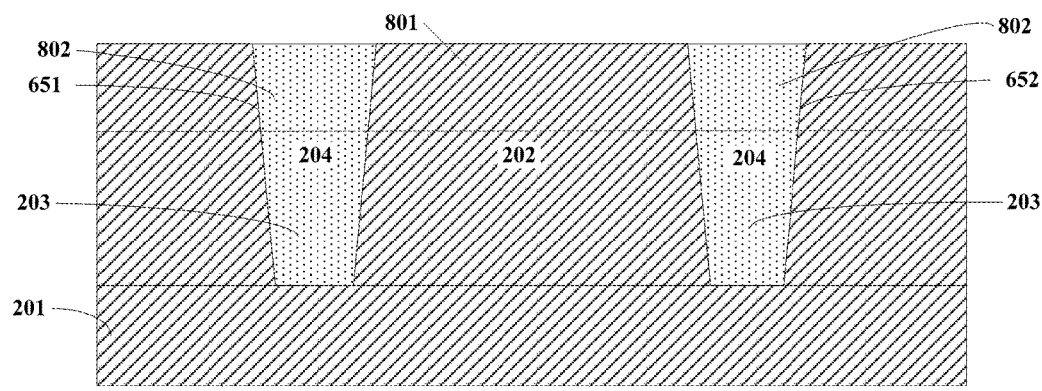
FIG. 8B is a simplified cross-sectional view illustrating a structure taken along the line M-M' of FIG. 8A.
Figure 8C:
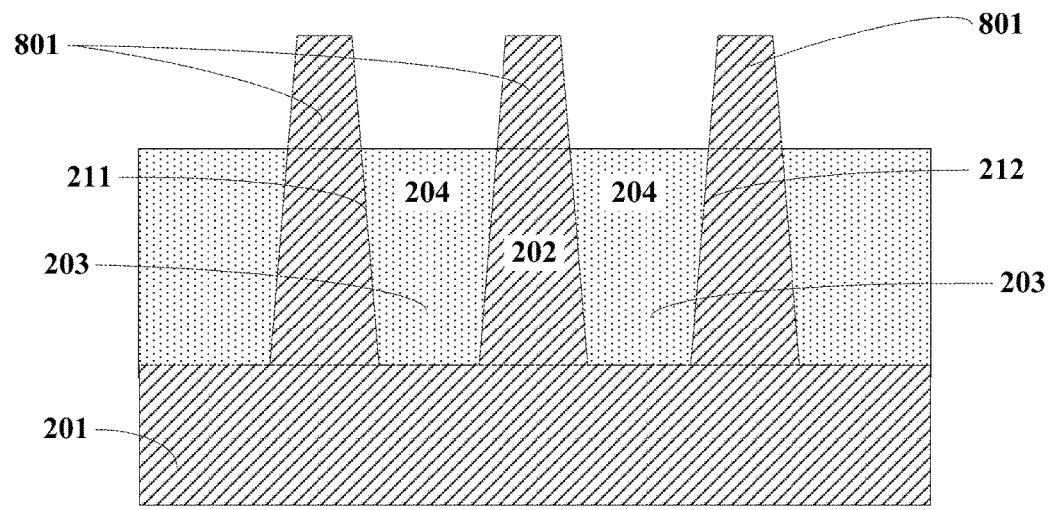
FIG. 8C is a simplified cross-sectional view illustrating a structure taken along the line N-N' of FIG. 8A.

FIG. 8A is a simplified plan view illustrating a structure of a stage in a manufacturing method of a semiconductor device in step S105 according to an embodiment of the present invention. FIG. 8B is a simplified cross-sectional view illustrating a structure taken along the line M-M' of FIG. 8A. FIG. 8C is a simplified cross-sectional view illustrating a structure taken along the line N-N' of FIG. 8A. Referring to FIGS. 8A through 8C, at least a portion of the insulating portion (e.g., first insulating portion 651 and second insulating portion 652) and at least a portion of the exposed portion of trench isolation structure 210 (e.g., first trench isolation portion 211 and second trench isolation portion 212) is removed (e.g., using RIE and/or wet etching process), such that the upper surfaces of first trench isolation portion 211 and second trench isolation portion 212 are lower than the upper surface of semiconductor fin 202 so as to expose an upper portion 801 of semiconductor fin 202 and expose an upper portion 802 of the insulating portion.

In one embodiment, the upper surface of the insulating portion after step S105 is substantially flush with the upper surface of the semiconductor fin, as shown in FIG. 8B.

Thus, embodiments of the present invention provide a method of manufacturing a semiconductor device.

According to embodiments of the present invention, the insulting portions (e.g., first insulating portion 651 and second insulating portion 652) in the recess at the distal ends (in the longitudinal direction) of the semiconductor fin are raised with respect to the conventional shallow trench isolation. For example, the upper surface of the insulting portions may be the same as the upper surface of the semiconductor fin, that may reduce the possibility of damage caused to the semiconductor fin in subsequent steps of removing the dummy gate (e.g., a second gate that will be described in detail below), thereby improving the device yield.

Further, the opening of the first hardmask layer may expose a distal end portion of the semiconductor fin in the longitudinal direction so that the formed first insulator layer may cover the distal end portion. Thus, in the step of removing at least a portion of the insulating portion (step S105), it is possible to obtain an improved upper surface of the insulating portion, so that an edge portion of the insulating portion can be prevented from having a recess, thereby reducing the possibility of damage to the semiconductor fin when removing a dummy gate.

Figure 9A:
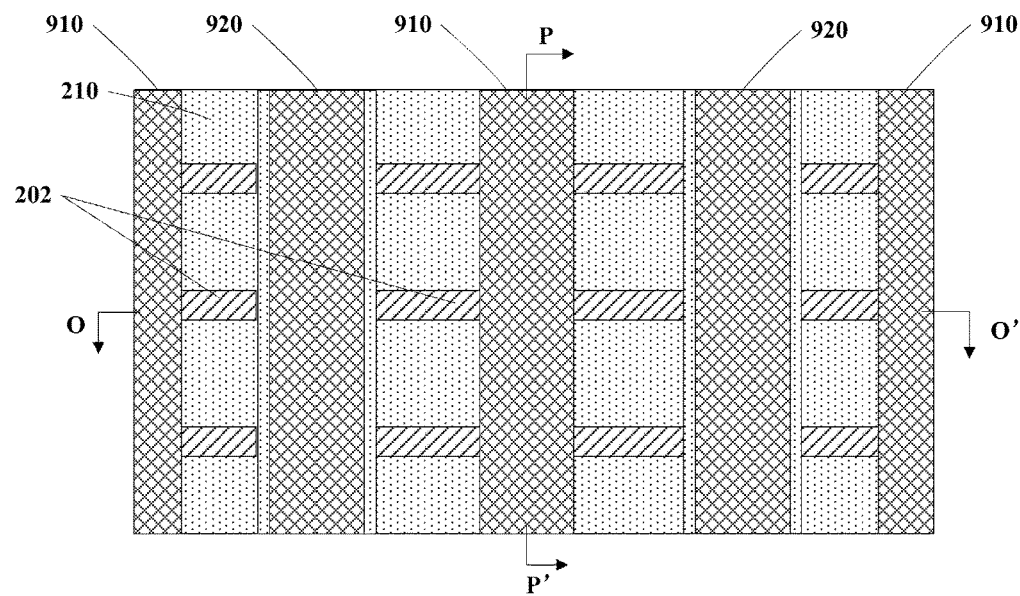
FIG. 9A is a simplified plan view illustrating a structure of a stage in a manufacturing method of a semiconductor device according to an embodiment of the present invention.
Figure 9B:
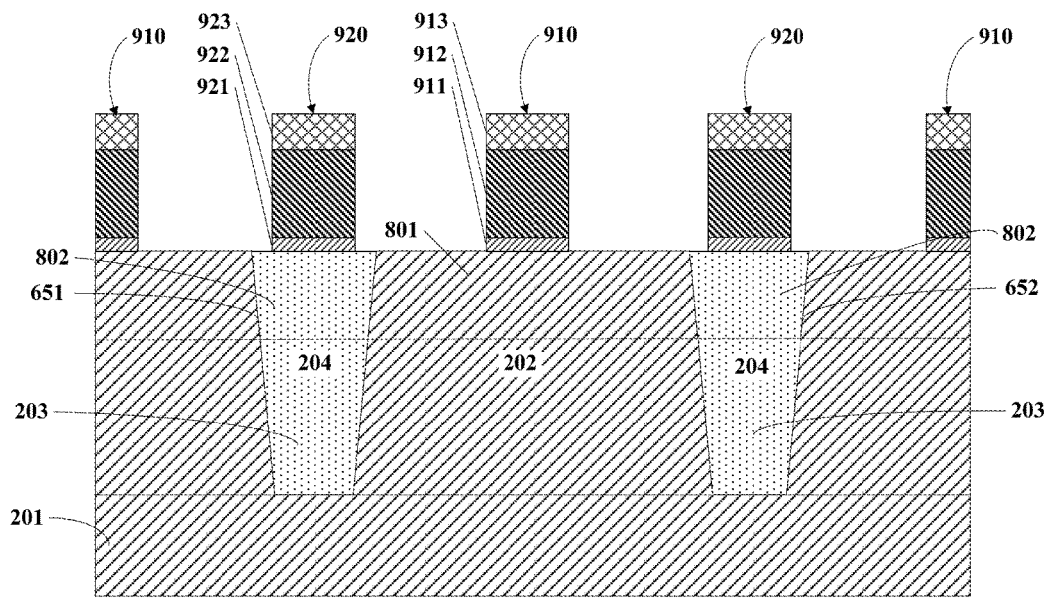
FIG. 9B is a simplified cross-sectional view illustrating a structure taken along the line O-O' of FIG. 9A.
Figure 9C:
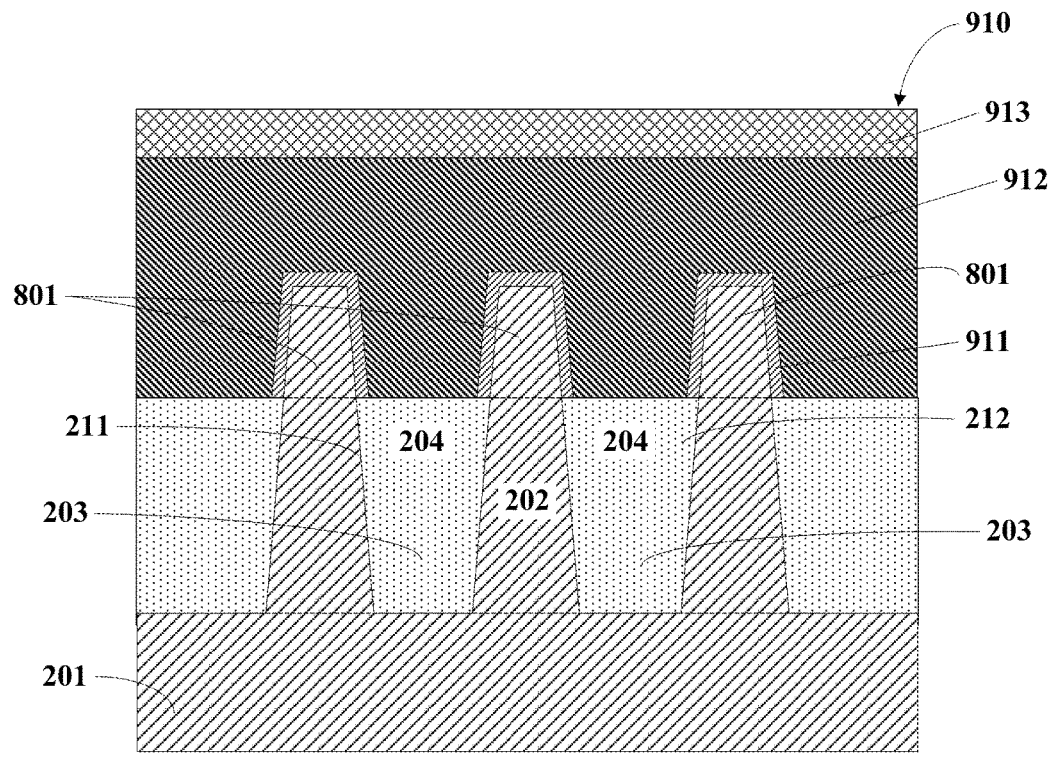
FIG. 9C is a simplified cross-sectional view illustrating a structure taken along the line P-P' of FIG. 9A.

In one embodiment, the method may further include forming a first gate structure 910 that surrounds a portion of upper portion 801 of semiconductor fin 202 and a second gate structure 820 that is on upper portion 802 of the insulating portion, as shown in FIGS. 9A, 9B, and 9C.

In one embodiment, first gate structure 910 may include a first gate insulator layer 911 surrounding a portion of upper portion 801 of semiconductor fin, a first gate 912 on first gate insulator layer 911, and a second hardmask layer 913 on first gate 912, as shown in FIG. 9B. In an exemplary embodiment, first gate insulator layer 911 may include silicon dioxide, first gate 912 may include polysilicon, and second hardmask layer 913 may include silicon nitride.

In one embodiment, second gate structure 920 may include a second gate insulator layer 921 on upper portion 802 of the insulating portion, a second gate 922 on second gate insulator layer 921, and a third hardmask layer 923 on second gate 922, as shown in FIG. 9B. In an exemplary embodiment, second gate insulator layer 921 may include silicon dioxide, second gate 922 may include polysilicon, and third hardmask layer 923 may include silicon nitride. In some embodiments, the first and second gate insulator layer are formed using a same process. The first and second gates are formed concurrently in a same gate forming process. In some embodiments, the second and third hardmask layers are formed in a same hardmask forming process.

Figure 10A:
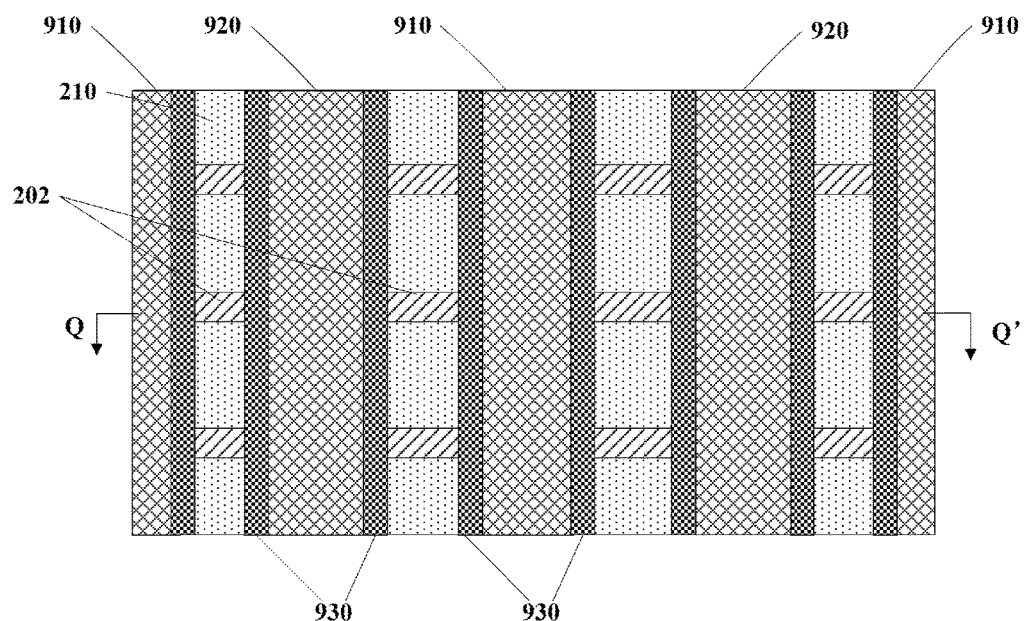
FIG. 10A is a simplified plan view illustrating a structure of a stage in a manufacturing method of a semiconductor device according to an embodiment of the present invention.
Figure 10B:
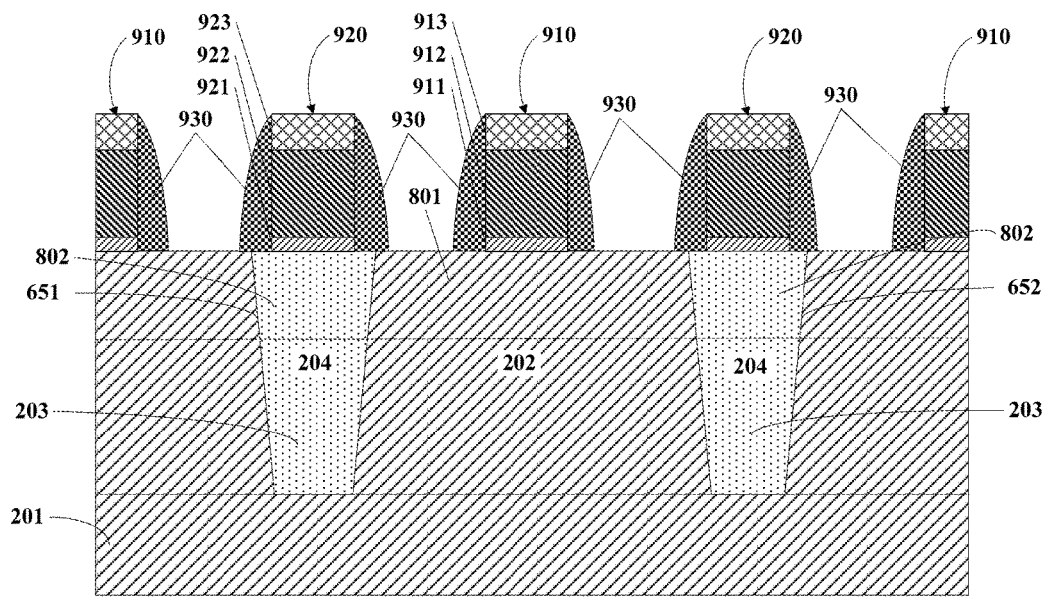
FIG. 10B is a simplified cross-sectional view illustrating a structure taken along the line Q-Q' of FIG. 10A.

In one embodiment, the method may further include spacers 930 on opposite sides of first gate structure 910 and on opposite sides of second gate structure 920, as shown in FIGS. 10A and 10B. Spacers 930 cover the distal ends of the semiconductor fin in the longitudinal direction. In an exemplary embodiment, spacers 930 may include silicon nitride.

Figure 11A:
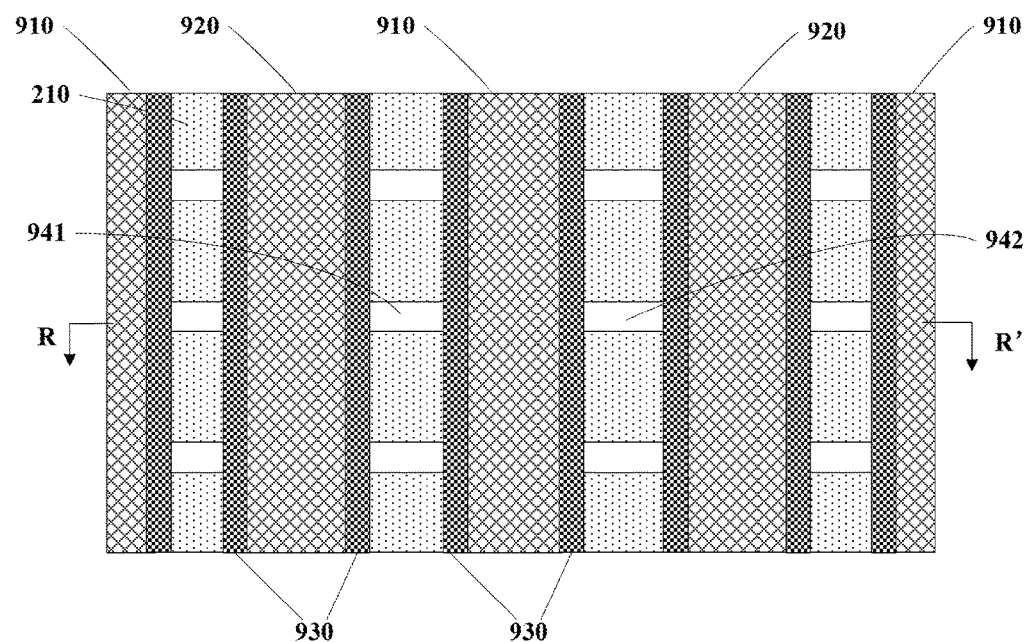
FIG. 11A is a simplified plan view illustrating a structure of a stage in a manufacturing method of a semiconductor device according to an embodiment of the present invention.
Figure 11B:
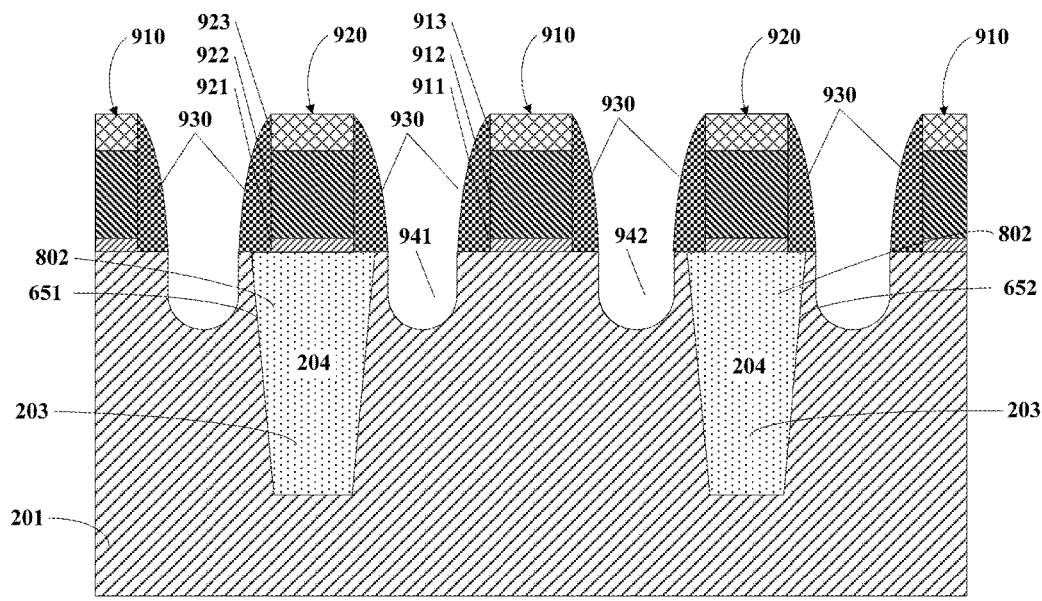
FIG. 11B is a simplified cross-sectional view illustrating a structure taken along the line R-R' of FIG. 11A.

In one embodiment, the method may further include performing an etching process on portions of the semiconductor fin that are not covered by first gate structure 910 and spacers 930 to form a recess, as shown in FIGS. 11A and 11B. In one embodiment, the etching process may include a self-aligning etching process. For example, the recess may include a first recess 941 and a second recess 942 disposed on opposite sides of first gate structure 910.

Figure 12A:
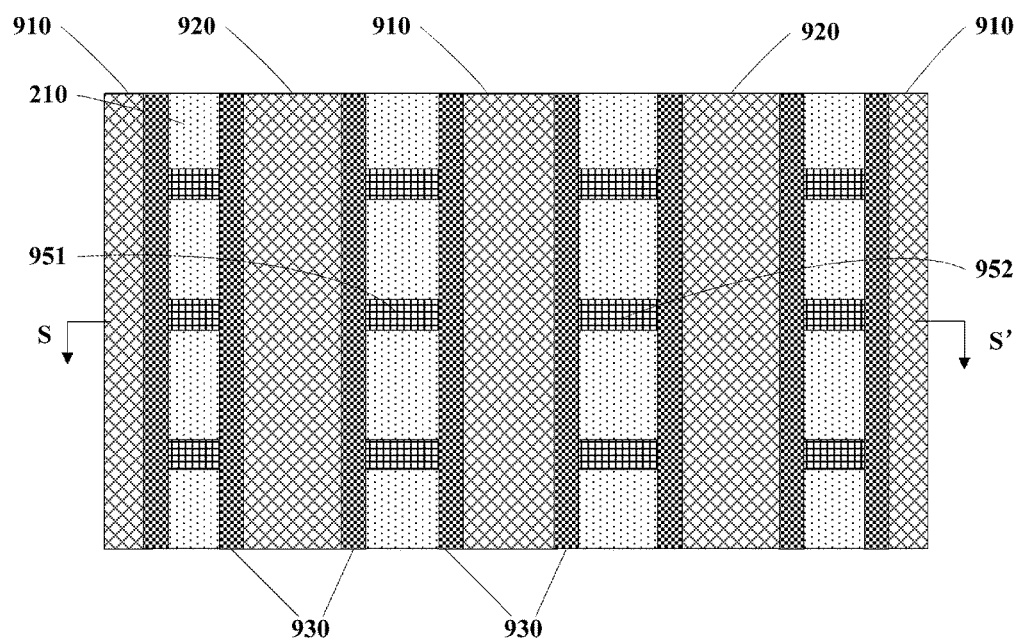
FIG. 12A is a simplified plan view illustrating a structure of a stage in a manufacturing method of a semiconductor device according to an embodiment of the present invention.
Figure 12B:
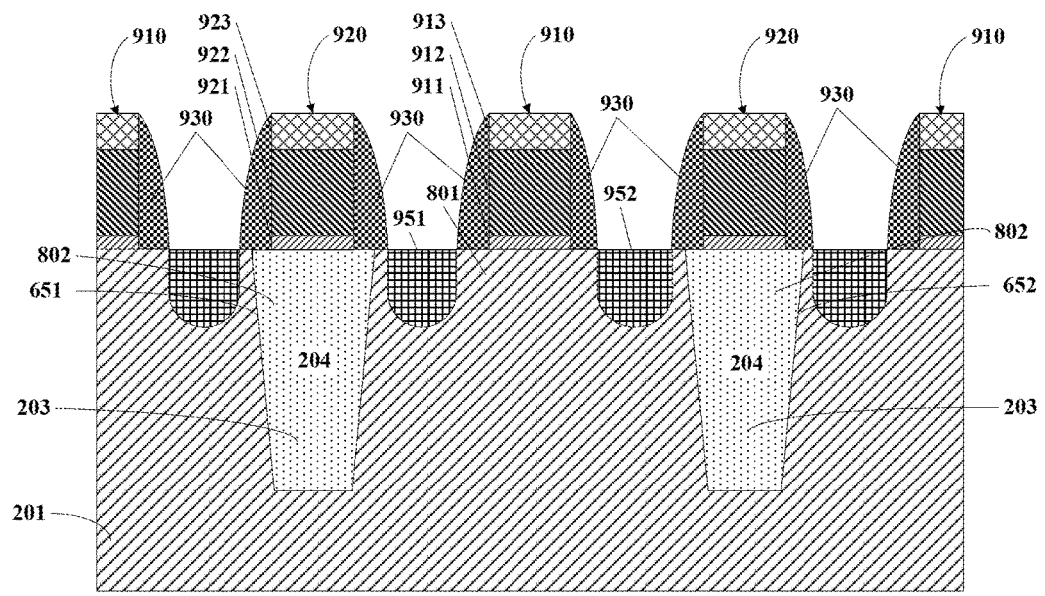
FIG. 12B is a simplified cross-sectional view illustrating a structure taken along the line S-S' of FIG. 12A.

In one embodiment, the method may further include forming a source or drain having a different material than that of the semiconductor fin. For example, a source 951 is formed in first recess 941, and a drain 952 is formed in second recess 942 using, e.g., an epitaxial process, as shown in FIGS. 12A and 12B.

Thus, a method of manufacturing a semiconductor has been provided according to embodiments of the present invention. The semiconductor device thus manufactured has a source or drain with more regular morphology and improved performance.

Further, without sacrificing the density of the device (e.g., transistor), the lateral dimension between the second gate and the distal ends of the semiconductor fin may be adjusted, for example, the distance between the second gate and the distal ends of the semiconductor fin can be relatively large, e.g., the lateral distance between second gate and the distal ends of the semiconductor fin may be in the range of 2 nm and 20 nm, so that the likelihood of causing damage to the semiconductor fin can be reduced in subsequent step of removing the second gate.

In accordance with embodiments of the present invention, the method of manufacturing a semiconductor device can provide process flexibility and wide process windows so that damage to the semiconductor fin can be reduced during the removal of a dummy gate (e.g., a second gate).

Embodiments of the present invention also provide a semiconductor device. Referring to FIGS. 8A, 8B, and 8C, the semiconductor device may include a substrate 201, at least one semiconductor fin 202 on substrate 201, and a trench isolation structure 210 surrounding the semiconductor fin. In one embodiment, trench isolation structure 210 is adjacent to semiconductor fin 202.

In one embodiment, trench isolation structure 210 may include a first trench isolation portion 211 and a second trench isolation portion 212 on opposite sides of the semiconductor fin along a first direction parallel to the longitudinal direction of the semiconductor fin, as shown in FIGS. 8A, 8B, and 8C.

In one embodiment, referring to FIGS. 8B and 8C, first trench isolation portion 211 and second trench isolation portion 212 each have an upper surface that is lower than the upper surface of semiconductor fins 202, thereby exposing an upper portion 801 of semiconductor fin 202 and an upper portion 802 of a first insulating portion 651 and a second insulating portion 652.

In one embodiment, referring to FIGS. 8B and 8C, the trench isolation structure may include a trench 203 adjacent to the semiconductor fin and a dielectric layer 204 filling trench 203. Dielectric layer 204 may include silicon dioxide.

Embodiments of the present invention also provide a semiconductor device, as shown in FIGS. 12A and 12B. The semiconductor device of FIGS. 12A and 12B may include the same or structure as that of the semiconductor device of FIGS. 8A, 8B, and 8C, that has been described in detail in above sections, and will not be repeated herein for the sake of brevity.

In one embodiment, referring to FIGS. 12A and 12B, the semiconductor device may further include a first gate structure 910 surrounding a portion of first upper portion 801 of semiconductor fins 202 and a second gate structure 920 disposed on a second upper portion 802 of a second gate structure 920.

In one embodiment, first gate structure 910 may include a first gate insulator layer 911 surrounding a portion of first upper portion 801, a first gate 912 on first gate insulator layer 911, and a second hardmask layer 913 on first gate 912. The first gate insulator layer may include silicon dioxide, the first gate may include polysilicon, and the second hardmask layer may include silicon nitride.

In one embodiment, second gate structure 920 may include a second gate insulator layer 921 on second upper portion 802, a second gate 922 on second gate insulator layer 921, and a third hardmask layer 923 on second gate 922. The second gate insulator layer may include silicon dioxide, the second gate may include polysilicon, and the third hardmask layer may include silicon nitride.

In one embodiment, referring to FIGS. 12A and 12B, the semiconductor device may further include spacers 930 on opposite side surfaces of first gate structure 910 and on the surface on opposite sides of second gate structure 920. Spacers 930 opposite side surfaces of second gate structure 920 cover the distal ends of the semiconductor fin in the longitudinal direction. In an example embodiment, spacers 930 may include silicon nitride.

In one embodiment, referring to FIGS. 12A and 12B, the semiconductor device may further include a source 951 and a drain 952 formed on opposite sides of first gate structure 910 and have a material different from the material of the semiconductor fin.

The semiconductor device according to embodiments of the present invention may include a source and a drain that have a more regular morphology, so that the performance and yield of the device can be improved, and the likelihood of damage caused to the semiconductor device during the removal of the dummy gate (e.g., the above-described second gate) is reduced.

References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily, referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Thus, embodiments of the present disclosure provide a detailed description of a method of manufacturing a semiconductor device and a semiconductor device manufactured by the described method. Details of well-known processes are omitted in order not to obscure the concepts presented herein.

It is to be understood that the above described embodiments are intended to be illustrative and not restrictive. Many embodiments will be apparent to those of skill in the art upon reviewing the above description. The scope of the disclosure should, therefore, be determined not with reference to the above description, but instead should be determined with reference to the appended claims along with their full scope of equivalents.

What is claimed is:

1. A method for manufacturing a semiconductor device, the method comprising:
   providing a substrate structure including a substrate, at least one semiconductor fin on the substrate, and a trench isolation structure surrounding and laterally abutting the semiconductor fin and having an upper surface flush with an upper surface of the semiconductor fin, the trench isolation structure comprising a first trench isolation portion and a second trench isolation portion disposed on opposite sides of the semiconductor fin along a first direction parallel to a longitudinal direction of the semiconductor fin, and a third trench isolation portion and a fourth trench isolation portion on distal ends of the semiconductor fin along a second direction intersecting the first direction;
   forming a patterned first hardmask layer having an opening on the substrate structure, the opening exposing an upper surface of the third and fourth trench isolation portions;
   forming a first insulator layer filling the opening to form an insulating portion including a portion of the first insulator layer in the opening and a portion of the trench isolation structure below the portion of the first insulator layer in the opening;
   removing the patterned first hardmask layer exposing a portion of the semiconductor fin below the patterned first hardmask layer and the upper surface of the trench isolation structure; and
   removing a portion of the first insulator layer and a portion of the exposed trench isolation structure such that an upper surface of the first and second trench isolation portions is lower than the upper surface of the semiconductor fin to expose an upper portion of the semiconductor fin and an upper portion of the insulating portion.

2. The method of claim 1, wherein forming the patterned first hardmask layer comprises:
forming a first hardmask layer on the substrate structure;
forming a patterned mask layer on the first hardmask layer;
etching the first hardmask layer using the patterned mask layer as a mask to form an opening that exposes an upper surface of the third and fourth trench isolation portions of the semiconductor fin; and
removing the patterned mask layer.

3. The method of claim 1, wherein forming the first insulator layer filling the opening comprises:
forming the first insulator layer on the substrate structure filling the opening and covers the patterned first hardmask layer; and
planarizing the first insulator layer to expose the upper surface of the patterned first hardmask layer.

4. The method of claim 1, wherein the opening also exposes opposite distal ends of the semiconductor fin in the longitudinal direction.

5. The method of claim 4, further comprising, after forming the patterned first hardmask layer and prior to forming the first insulator layer:
performing an etching process on the exposed third and fourth trench isolation portions and the distal ends of the semiconductor fin.

6. The method of claim 1, wherein the trench isolation structure comprises a trench adjacent to the semiconductor fin and a dielectric layer filling the trench.

7. The method of claim 6, wherein:
the patterned first hardmask layer comprises silicon nitride;
the first insulator layer comprises silicon dioxide;
the dielectric layer comprises silicon dioxide.

8. The method of claim 1, further comprising forming a first gate structure surrounding a portion of the upper portion of the semiconductor fin and a second gate structure on the upper portion of the insulating portion.

9. The method of claim 8, wherein:
the first gate structure comprises a first gate insulator layer surrounding a portion of the upper portion of the semiconductor fin, a first gate on the first gate insulator layer, and a second hardmask layer on the first gate;
the second gate structure comprises a second gate insulator layer on the upper portion of the insulating portion, a second gate on the second gate insulator layer, and a third hardmask layer on the second gate.

10. The method of claim 9, wherein:
the first gate insulator layer and the second gate insulator layer each comprise silicon dioxide;
the first gate and the second gate each comprise polysilicon;
the second hardmask layer and the third hardmask layer each comprise silicon nitride.

11. The method of claim 8, further comprising:
forming spacers on opposite side surfaces of the first gate structure and on opposite side surfaces of the second gate structure, wherein the spacers cover the distal ends of the semiconductor fin in the longitudinal direction.

12. The method of claim 11, further comprising:
removing by etching a portion of the semiconductor fin that is not covered by the first gate structure and the spacers to form a recess region; and
forming a source or a drain having a material different than a material of the semiconductor fin in the recess region.

13. The method of claim 12, wherein the recess region comprises a first recess and a second recess on opposite sides of the first gate structure; and
forming the source or the drain comprises forming the source in the first recess and forming the drain in the second recess.

14. A semiconductor device, comprising:
a substrate;
at least one semiconductor fin on the substrate;
a trench isolation structure surrounding and laterally abutting the semiconductor fin, the trench isolation structure comprising:
first and second trench isolation portions on opposite sides of the semiconductor fin along a first direction parallel to a longitudinal direction of the semiconductor fin; and
third and fourth trench isolation portions on opposite distal ends of the semiconductor fin along a second direction intersecting the first direction,
wherein the first and second trench isolation portions each have an upper surface that is lower than an upper surface of the semiconductor fin to expose an upper portion of the semiconductor fin and an upper portion of the first and second trench isolation portions;
a first gate structure surrounding a portion of the upper portion of the semiconductor fin; and
a second gate structure on the upper portion of the first and second trench isolation portions.

15. The semiconductor device of claim 14, wherein the trench isolation structure comprises a trench adjacent to the semiconductor fin and a dielectric layer filling the trench.

16. The semiconductor device of claim 14, wherein:
the first gate structure comprises a first gate insulator layer surrounding a portion of the upper portion of the semiconductor fin, a first gate on the first gate insulator layer, and a second hardmask layer on the first gate;
the second gate structure comprises a second gate insulator layer on the upper portion of the first and second trench isolation portions, a second gate on the second gate insulator layer, and a third hardmask layer on the second gate.

17. The semiconductor device of claim 16, wherein:
the first gate insulator layer and the second insulator layer each comprise silicon dioxide;
the first gate and the second gate each comprise polysilicon;
the second hardmask layer and the third hardmask layer each comprise silicon nitride.

18. The semiconductor device of claim 14, further comprising:
spacers on opposite side surfaces of the first gate structure and on opposite side surfaces of the second gate structure, wherein the spacers cover the distal ends of the semiconductor fin in the longitudinal direction.

19. The semiconductor device of claim 18, further comprising:
a source or a drain having a material different than a material of the semiconductor fin on opposite sides of the first gate structure.

20. The semiconductor device of claim 15, wherein the dielectric layer comprises silicon dioxide.

* * * * *